(12) United States Patent
Bambridge et al.

(10) Patent No.: US 7,030,472 B2
(45) Date of Patent: Apr. 18, 2006

(54) INTEGRATED CIRCUIT DEVICE HAVING FLEXIBLE LEADFRAME

(75) Inventors: Timothy Brooks Bambridge, Pittstown, NJ (US); Jeffery J. Gilbert, Schwenksville, PA (US); Juan Alejandro Herbsommer, Lehigh County, PA (US); Jeffrey Michael Klemovage, Whitehall, PA (US); George John Libricz, Jr., Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 4 days.

(21) Appl. No.: 10/816,060

(22) Filed: Apr. 1, 2004

(65) Prior Publication Data

US 2005/0224926 A1    Oct. 13, 2005

(51) Int. Cl.
*H01L 23/495* (2006.01)

(52) U.S. Cl. ............... 257/666; 257/675; 257/676; 257/706; 257/711; 257/713

(58) Field of Classification Search .............. None
See application file for complete search history.

(56) References Cited

U.S. PATENT DOCUMENTS

| | | | | | |
|---|---|---|---|---|---|
| 4,954,878 | A | * | 9/1990 | Fox et al. | 257/675 |
| 5,010,038 | A | * | 4/1991 | Fox et al. | 438/106 |
| 5,095,361 | A | * | 3/1992 | Iwata | 257/706 |
| 5,096,853 | A | * | 3/1992 | Yasunaga et al. | 29/827 |
| 5,319,242 | A | * | 6/1994 | Carney et al. | 257/680 |
| 5,355,019 | A | * | 10/1994 | Fuchs | 257/698 |
| 5,631,191 | A | * | 5/1997 | Durand et al. | 438/119 |
| 5,859,471 | A | * | 1/1999 | Kuraishi et al. | 257/666 |
| 2002/0140075 | A1 | | 10/2002 | Laureanti | |
| 2003/0013234 | A1 | | 1/2003 | Bregante et al. | |
| 2003/0085464 | A1 | | 5/2003 | Lang | |
| 2004/0124003 | A1* | | 7/2004 | Ryu et al. | 174/254 |

* cited by examiner

*Primary Examiner*—Andy Huynh

(57) ABSTRACT

An integrated circuit device having a flexible leadframe, and techniques for fabricating the flexible leadframe and integrated circuit device, are provided. In one aspect of the invention, an integrated circuit device comprises a heat spreader having a top surface and a bottom surface. At least one integrated circuit die is attached to the top surface of the heat spreader. A flexible leadframe is also attached to the top surface of the heat spreader. The flexible leadframe has one or more flexible layers, including at least one flexible insulating layer. A plurality of electrically conductive traces are defined on the at least one flexible insulating layer.

11 Claims, 5 Drawing Sheets

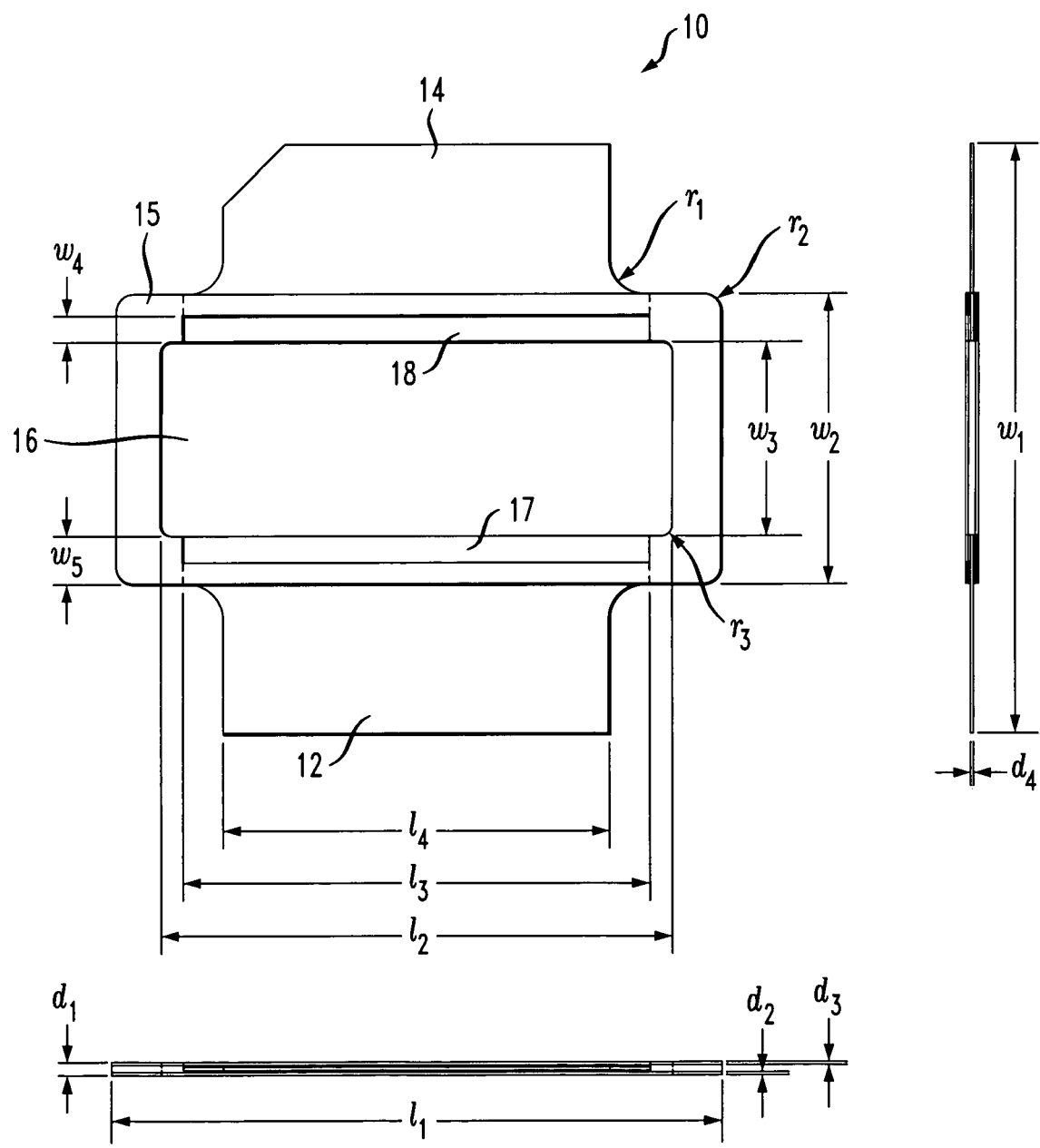

INTEGRATED CIRCUIT DEVICE HAVING FLEXIBLE LEADFRAME

FIELD OF THE INVENTION

The present invention relates generally to the field of packaged integrated circuits and, more particularly, to an integrated circuit (IC) device which includes a leadframe.

BACKGROUND OF THE INVENTION

An integrated circuit is generally fabricated utilizing a chip of silicon or other semiconductor material, also referred to as a die. A die is typically installed in a package, and electrically connected to leads of the package. These leads may then be soldered to traces on a printed wiring board (PWB), or other circuit mounting structure, to provide connections between the die and external circuitry.

A number of different cavity packages are known in the art, and may be used, by way of example, to package a Radio Frequency Laterally Diffused Metal Oxide Semiconductor (RFLDMOS) device or other integrated circuit device. In one type of cavity package, a die is sealed inside a protective enclosure. Leads penetrate the walls of the protective enclosure so that they may be electrically connected to the die. These packages are known in the electronics industry as "air-cavity packages," since the die resides in a hollow air-filled cavity inside the enclosure.

A cavity package dissipates heat, which the die generates during use, through the floor, or heat spreader, of the package. For this reason a heat-conductive material, generally a metal plate, is used as the heat spreader. A high-temperature, heat-conductive solder joins the die to the heat spreader. Packages are generally formed by bonding sidewalls, having leads passing through them, to the heat spreader to form the body of the package. Once the body is formed, the die is placed inside the body and secured to the heat spreader. Wire bonding is performed to join the die circuitry to the leads, and the package is completed by securing a lid to the body with an appropriate adhesive. Examples of cavity packages and associated packaging methods are described in U.S. patent application Publication No. US 2003/0013234 A1 to Bregante et al. and U.S. patent application Publication No. US 2003/0085464 A1 to Lang.

A high soldering temperature (e.g., 400° C.) is typically needed to secure the die to the heat spreader of the cavity package. The sidewalls of the package therefore must be constructed of a material that can withstand the high temperature. For this reason, cavity package sidewalls and lids may be constructed of a ceramic material. However, the ceramic materials used are expensive. Manufacturing costs can be reduced considerably if the ceramic materials are replaced by plastic materials, but plastics do not readily withstand the high soldering temperature, and the manufacturing process must therefore be altered. Further, while plastic and overmolded plastic cavity packages incorporate less expensive materials than ceramic packages, their processing and tooling may be expensive. Finally, seals created on the plastic package are generally less reliable than those created on the ceramic package due to moisture diffusion through the plastic.

Conventional cavity packages of the type described above typically require that any additional circuit components, including signal filters, tuning capacitors and inductors, be mounted inside the cavity of the package or on the PWB outside the package. These cavity packages may also require external shielding in high frequency applications.

Thus, a need exists for an integrated circuit device that may be manufactured inexpensively while being versatile in incorporating additional circuit components and shielding within the integrated circuit device.

SUMMARY OF THE INVENTION

The present invention provides an integrated circuit having a flexible leadframe, as well as methods of fabricating the flexible leadframe and incorporating the flexible leadframe into the integrated circuit device.

In accordance with one aspect of the invention, a flexible leadframe comprises one or more flexible layers, including at least one flexible insulating layer. A plurality of electrically conductive traces are defined on the at least one flexible insulating layer and configured for use in an integrated circuit device.

An integrated circuit device incorporating the flexible leadframe comprises a heat spreader having a top surface and a bottom surface. At least one integrated circuit die is attached to the top surface of the heat spreader. The flexible leadframe, as described above, is also attached to the top surface of the heat spreader.

In accordance with another aspect of the invention, a flexible leadframe is fabricated by defining a plurality of electrically conductive traces on at least one flexible insulating layer of the one or more flexible layers configured for use as a flexible leadframe in an integrated circuit device.

In accordance with a further aspect of the invention, an integrated circuit device is fabricated by attaching at least one integrated circuit die, and the flexible leadframe, as described above, to the top surface of the heat spreader. The integrated circuit die is then electrically connected to the flexible leadframe.

The present invention in an illustrative embodiment provides an integrated circuit device that can be manufactured inexpensively, and which permits increased versatility in the incorporation of circuit components and shielding.

These and other objects, features, and advantages of the present invention will become apparent from the following detailed description of the illustrative embodiments thereof, which is to be read in connection with the accompanying drawings.

BRIEF DESCRIPTION OF THE DRAWINGS

FIG. 1 shows top and side views of a flexible leadframe, according to an embodiment of the present invention;

FIG. 5b shows an exploded view of the alternative embodiment of the flexible leadframe shown in FIG. 5a;

DETAILED DESCRIPTION

Figure 2A:
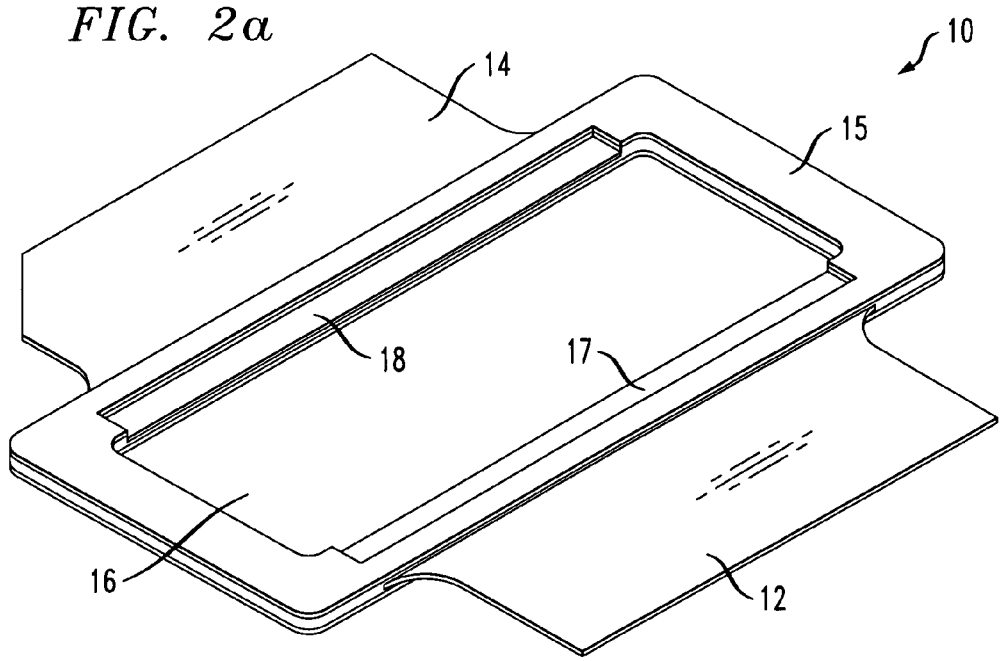
FIG. 2a shows a perspective view of the flexible leadframe of FIG. 1.

As will be described in detail below, the present invention in the illustrative embodiment provides an integrated circuit device having a flexible leadframe, as well as techniques for fabricating the flexible leadframe and incorporating the flexible leadframe into the integrated circuit device.

Referring initially to FIG. 1, a diagram illustrates top and side views of a flexible leadframe 10, according to an embodiment of the present invention. The views provided in FIG. 1 illustrate the elements and the dimensions of the flexible leadframe in the illustrative embodiment. Two leads 12, 14 extend outward from two opposing sides of flexible leadframe 10. A main body 15 of flexible leadframe 10 has an open interior area 16. Leads 12, 14 have exposed areas 17, 18 accessible from interior area 16.

Regarding the dimensions of flexible leadframe 10, for example, in the illustrative embodiment of FIG. 1, a length $l_1$ of flexible leadframe 10 may be approximately 0.78 inches (in.), while a length $l_2$ of interior area 16 may be approximately 0.66 in. Leads 12, 14 have a length $l_3$ of approximately 0.60 in., when the curved transitions to main body 15 are included in the measurement. A length $l_4$, which excludes these transitions, may be approximately 0.50 in.

In further defining dimensions of this illustrative embodiment, a width $w_1$ of flexible leadframe 10, including leads 12, 14, may be approximately 0.76 in., while a width $w_2$ of flexible leadframe 10, excluding leads 12, 14, may be approximately 0.38 in. A width $w_3$ of interior area 16 may be approximately 0.25 in. A width $w_4$ of exposed areas 17, 18 may be approximately 0.04 in., while a width $w_5$ of a side of main body 15, including exposed areas 17, 18, may be approximately 0.06 in.

Additionally, a depth $d_1$ of flexible leadframe 10, in this illustrative embodiment, may be approximately 0.02 in., while depths $d_2$, $d_3$ of main body 15, above and below leads 12, 14, may be approximately 0.004 in. A depth $d_4$ of leads 12, 14 may be approximately 0.003 in. Finally, a radius of curvature $r_1$ of flexible leadframe 10, where leads 12, 14 transition to main body 15, may be approximately 0.05 in., while a radius of curvature $r_2$ at the corners of main body 15 may be approximately 0.03 in.

It should be noted that the above-noted leadframe, elements and the associated dimensions, are presented by way of illustrative example only. Those skilled in the art will recognize that numerous alternative leadframe configurations and dimensions may be used in implementing the invention.

Referring now to FIG. 2a, a diagram illustrates a perspective view of the assembled flexible leadframe of FIG. 1. It can be seen that, as noted previously, leads 12, 14 extend out from opposing sides of main body 15, and have exposed areas 17, 18 accessible from interior area 16 of flexible leadframe 10.

Figure 2B:
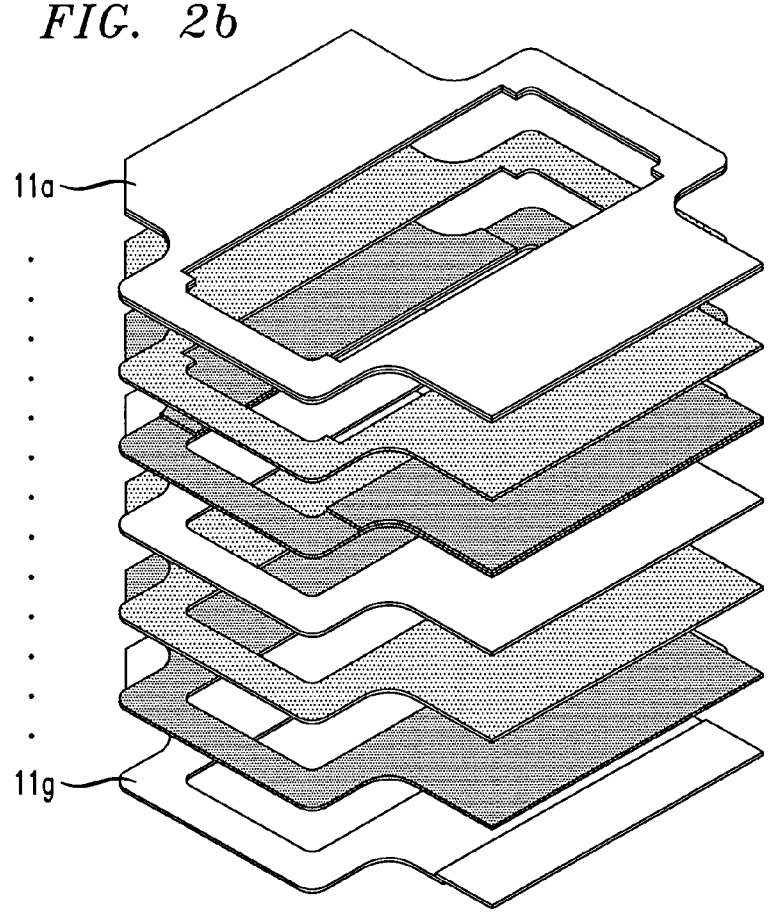
FIG. 2b shows an exploded view of multiple layers of the flexible leadframe of FIG. 1.

FIG. 2b shows a diagram illustrating an exploded view of the layers of flexible leadframe 10 of FIG. 1. Flexible leadframe 10 may comprise one or more flexible layers. Leads 12, 14 are included in this stack of one or more flexible layers. The present invention in the illustrative embodiment shows seven flexible layers, 11a–11g, each of which may comprise a polyimide layer. A plurality of electrically conductive traces are defined on at least one of the polyimide layers. These polyimide layers are stacked, laminated together, and configured for use as a flexible leadframe in an integrated circuit device, as will be described below in conjunction with FIGS. 6 and 7. The use of polyimide is presented by way of example only, and other materials may be used in alternative embodiments. As a more specific example, the layers may comprise Dupont Pyralux™ double-sided, copper-clad laminate, which is an all-polyimide composite of polyimide film bonded to copper foil.

Figure 3:
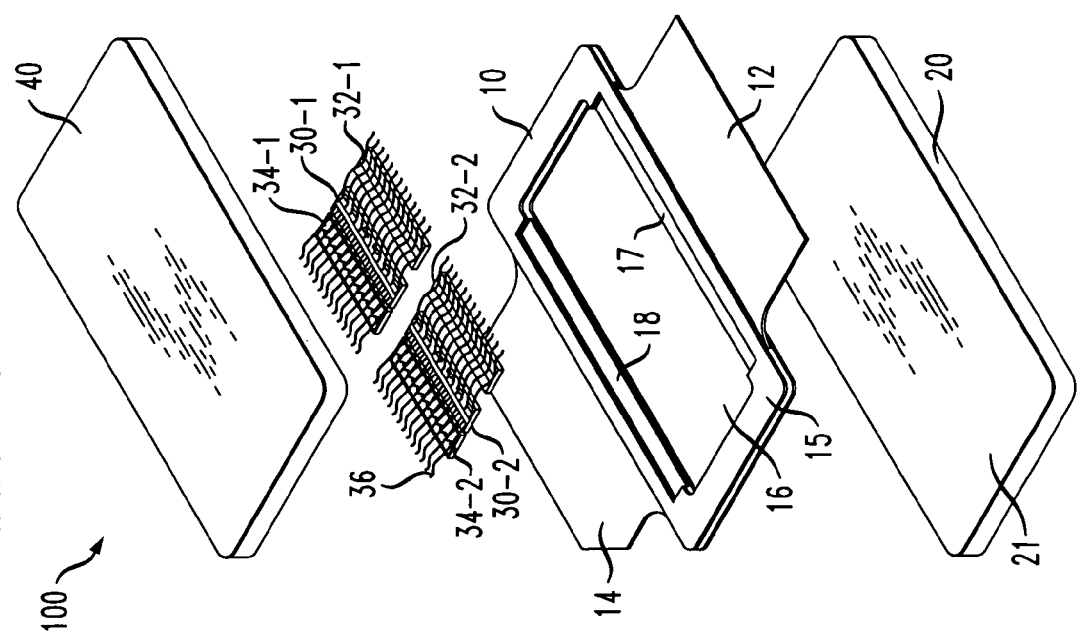
FIG. 3 shows an exploded view of an integrated circuit device having a flexible leadframe, according to an embodiment of the present invention.

Referring now to FIG. 3, an exploded view of an integrated circuit device 100, which includes flexible leadframe 10 is shown. Integrated circuit device 100 further includes a heat spreader 20 having a top surface 21, and at least one integrated circuit die. Flexible leadframe 10 may have embedded circuit components including one or more signal filters, tuning capacitors, or inductors as will be described in conjunction with FIGS. 5a and 5b. Integrated circuit device 100 in the illustrative embodiment includes two integrated circuit dies 30-1, 30-2, and four capacitors 32-1, 34-1, 32-2, 34-2. Two capacitors are disposed on opposing sides of each die. The dies and capacitors are electrically connected, for example, through multiple sets of wire bonds 36, as will be appreciated by those skilled in the art. Integrated circuit device 100 also includes a lid 40, which may be formed of metal, plastic, polyimide, plastic with metal coating, ceramic, or other suitable material.

Figure 4:
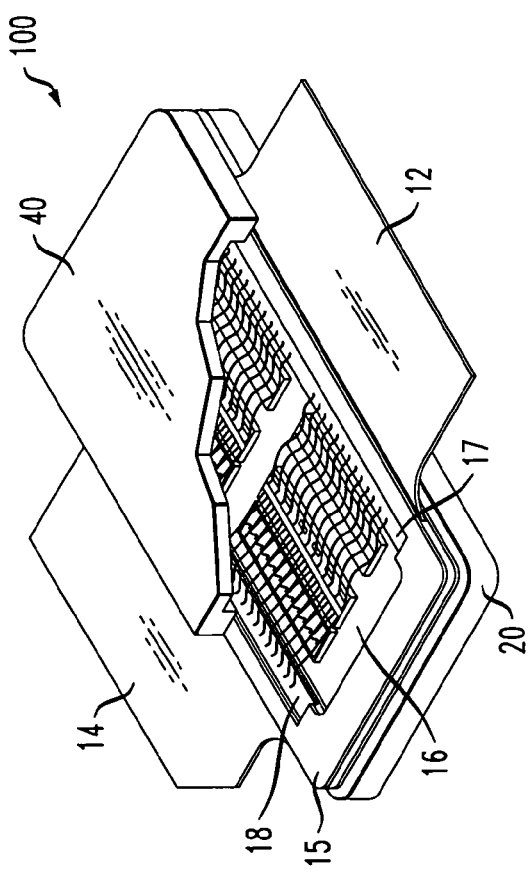
FIG. 4 is a partial cut-away view of the assembled integrated circuit device of FIG. 3, having a flexible leadframe and partially removed lid.

FIG. 4 illustrates the assembled integrated circuit device of FIG. 3. Integrated circuit dies 30-1, 30-2, and capacitors 32-1, 32-2, 34-1, 34-2, are attached to top surface 21 of heat spreader 20. Flexible leadframe 10, having one or more flexible layers, as described above, is also attached to top surface 21 of heat spreader 20. Flexible leadframe 10 and top surface 21 of heat spreader 20 define interior area 16 configured for receiving at least one integrated circuit die. As shown, interior area 16 may also accommodate capacitors or other circuit elements. Lid 40 encloses interior area 16 configured for receiving integrated circuit dies 30-1, 30-2, and capacitors 32-1, 32-2, 34-1, 34-2. Lid 40 is shown as partially removed in the figure so that interior area 16 is visible. Sets of wire bonds 36 extend from exposed area 17 to first capacitors 32-1, 32-2, from first capacitors 32-1, 32-2 to integrated circuit dies 30-1, 30-2, from integrated circuit dies 30-1, 30-2 to second capacitors 34-1, 34-2, and from integrated circuit dies 30-1, 30-2 to exposed area 18, for each capacitor-die-capacitor arrangement. As indicated previously, exposed areas 17, 18 are part of flexible leadframe 10. Advantageously, the flexible leadframe of the illustrative embodiment may include several layers of metal which may be customized to incorporate embedded circuit components, high frequency traces. Further, certain layers, such as the top and bottom metallization layers, may be constructed to include lands for surface-mount devices for signal filters and tuning circuit components.

Figure 5A:
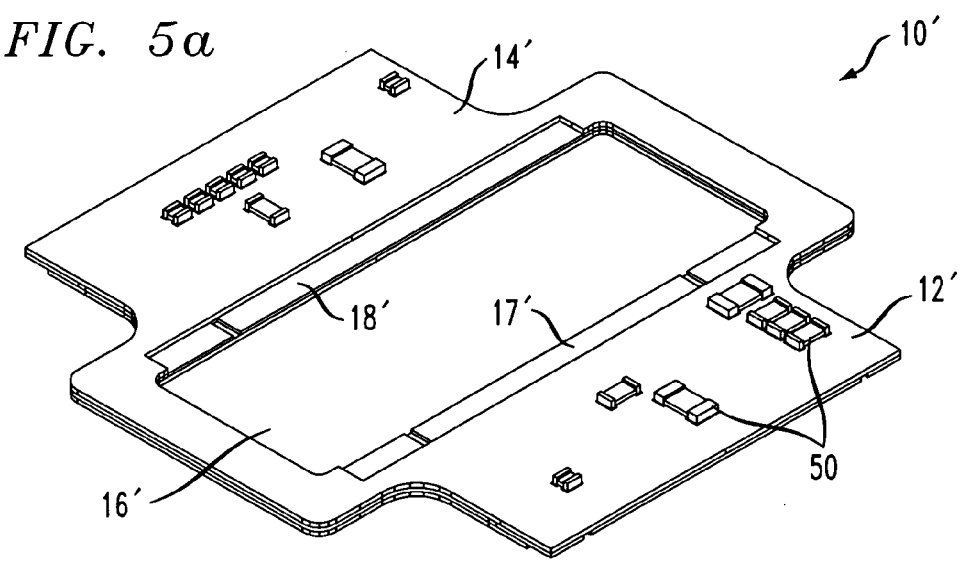
FIG. 5a shows a perspective view of an alternative embodiment of a flexible leadframe having embedded passives and surface-mount devices, according to an embodiment of the present invention.

Referring now to FIG. 5a, a diagram illustrates a perspective view of an alternative embodiment of assembled flexible leadframe 10'. It can be seen that, as in the previously-described embodiment, leads 12', 14' extend out from opposing sides of main body 15', and have exposed areas 17', 18' accessible from interior area 16' of flexible leadframe 10'. Surface mount devices 50 are disposed on leads 12', 14'.

Figure 5B:
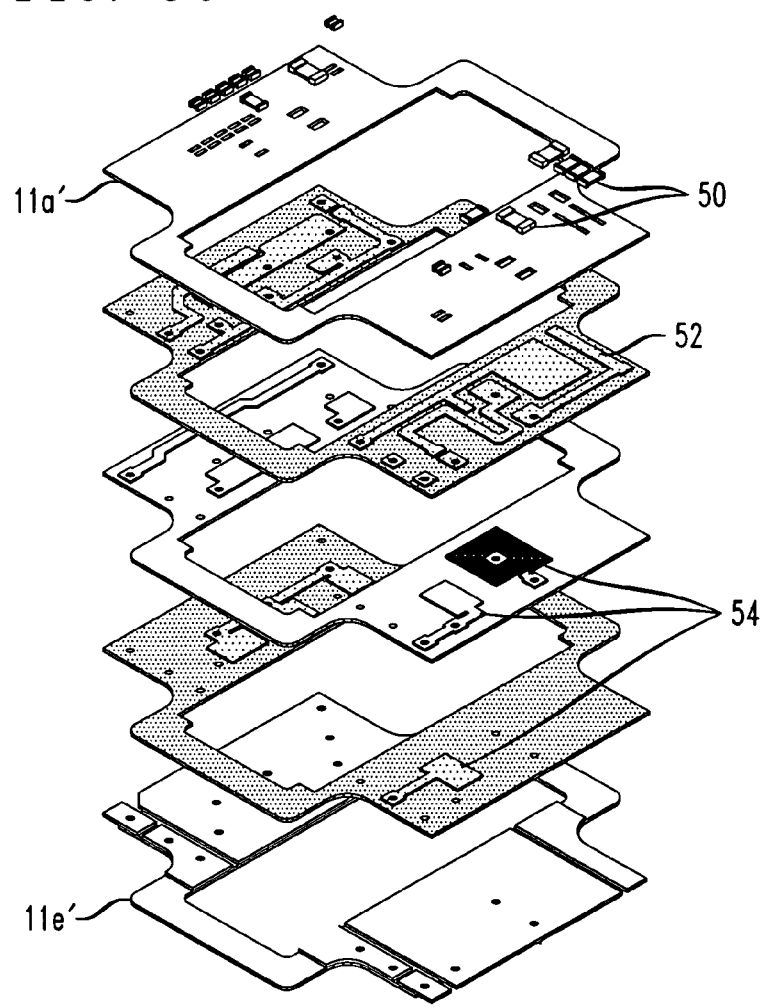

FIG. 5b shows a diagram illustrating an exploded view of the layers of flexible leadframe 10' of FIG. 5a. Flexible leadframe 10' may comprise one or more flexible layers. The present invention in the alternative embodiment shows five flexible layers, 11a'–11e', each of which may comprise a polyimide layer. A plurality of surface-mount devices 50, electrically conductive traces 52 and embedded passives 54, which may include signal filters, tuning capacitors, inductors, or other elements, are defined on at least one of the polyimide layers. These polyimide layers are stacked, laminated together, and configured for use as a flexible leadframe in an integrated circuit device, as will be described below in conjunction with FIGS. 6 and 7. The use of polyimide is presented by way of example only, and other materials may be used in alternative embodiments.

Figure 6:
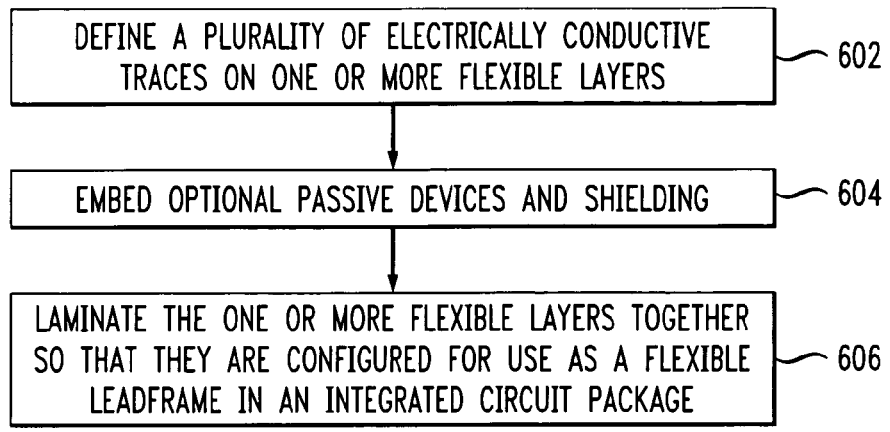
FIG. 6 is a flow diagram illustrating a flexible leadframe fabrication methodology, according to an embodiment of the present invention.

Referring now to FIG. 6, a flow diagram illustrates a flexible leadframe fabrication methodology, according to an embodiment of the present invention.

In block 602, electrically conductive traces are defined on at least one flexible insulating layer of one or more flexible layers. For example, copper traces may be photolithographically defined on the one or more layers according to the desired design of the integrated circuit device.

In block 604, optional passive devices and shielding may be embedded in the flexible layers.

In block 606, the one or more flexible layers are stacked together so that they are configured for use as a flexible leadframe in an integrated circuit device. In the illustrative embodiment the flexible layers may be held together through a lamination process, as will be appreciated by those skilled in the art. This example methodology may be used to form flexible leadframes 10 and 10' of FIGS. 1 through 5b.

Figure 7:
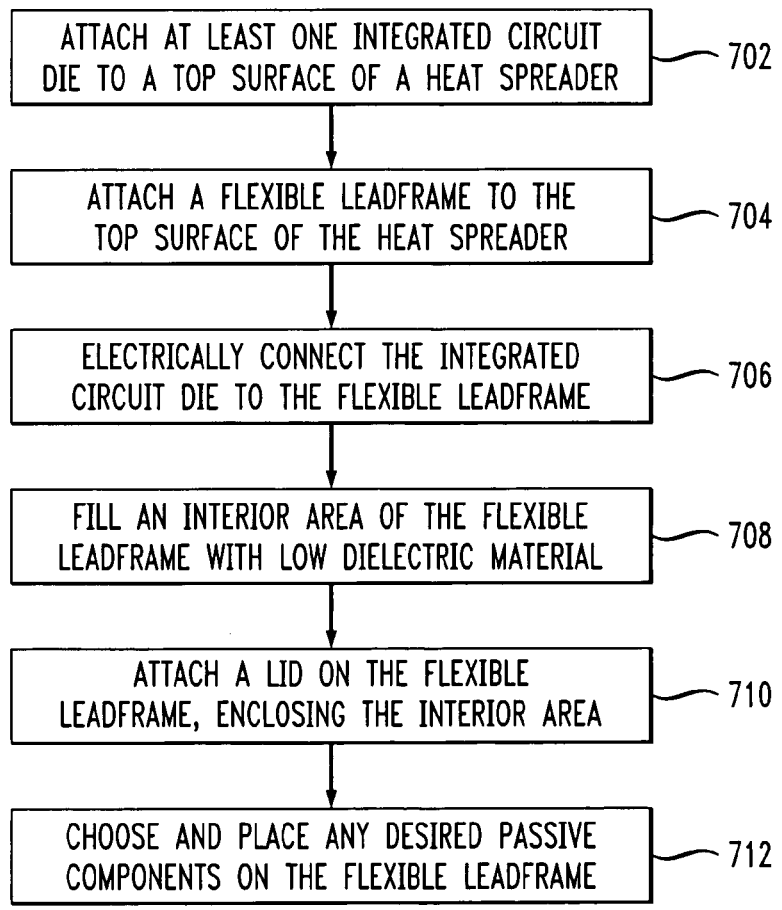
FIG. 7 is a flow diagram illustrating an integrated circuit device fabrication methodology, according to an embodiment of the present invention.

Referring now to FIG. 7, a flow diagram illustrates an integrated circuit device fabrication methodology, according to an embodiment of the present invention.

In block 702, at least one integrated circuit die is attached to a top surface of a heat spreader, such as top surface 21 of heat spreader 20 in FIG. 3. This attachment is achieved using, for example, epoxy or solder, as will be appreciated by those skilled in the art.

In block 704, a flexible leadframe is also attached to the top surface of the heat spreader. The flexible leadframe may comprise flexible leadframe 10 or 10' comprising one or more flexible layers as described above.

If a high-temperature solder will be used to attach an integrated circuit die to the heat spreader. Flexible leadframe 10, 10' may be provided with a peel-and-stick adhesive so that flexible leadframe 10, 10' may be attached to the heat spreader after the integrated circuit die is attached. A high-temperature solder is, for example, an AuSi solder having a temperature of approximately 400° C. When an epoxy or a mid- to low-temperature solder will be used to attach the integrated circuit die, flexible leadframe 10, 10' may be laminated to heat spreader 20, forming a cavity-type package, before the integrated circuit die is attached to the heat spreader. A low-temperature solder is, for example, an AuSi solder having a temperature of approximately 300° C. Thus, when an epoxy or a mid- to low-temperature solder is used, block 704 may be performed before block 702.

In block 706, the integrated circuit die is electrically connected to flexible leadframe 10, 10' through, for example, wire bonding dies, capacitors or other elements to exposed areas 17, 18 of leads 12, 14 accessible from interior area 16. The bonds may be, for example, Au ball bonds, tab bonds, or Au or Al wedge bonds, which will be appreciated by those skilled in the art. Further, a conventional wire-bonding process may be used, in which a lead is wire-bonded to a first capacitor, a first capacitor is wire-bonded to a die, a die is wire-bonded to a second capacitor, and a die is wire-bonded to a second lead.

In block 708, the interior area is filled with a low dielectric material to achieve preferred parasitic values for an RF application. This low dielectric material may be, for example, a conventional glob top material or simply air.

In block 710, lid 40 is attached to flexible leadframe 10, 10' enclosing interior area 16. Lid 40 may be attached with, for example, a heat curable adhesive, a solder, if a metal sealing ring is provided, or a peel-and-stick adhesive designed for a flexible leadframe. Alternatively, lid 40 may be attached prior to filling interior area 16 with a low dielectric material. This may be achieved, for example, by providing a hole in lid 40, so that interior area 16 may be accessed from outside the package.

In block 712 passive components may be chosen and placed on the flexible leadframe. These passive components may be, for example, surface mount devices 50 shown in FIGS. 5a and 5b. An electrical test is typically performed after the device has been assembled. This example methodology may be used to form the integrated circuit device shown in FIGS. 3 and 4.

Accordingly, as described herein, the present invention in the illustrative embodiment provides a flexible leadframe for use in an integrated circuit device and, more particularly, techniques for fabricating the flexible leadframe and incorporating the flexible leadframe into the integrated circuit.

Additional embodiments of the present invention may incorporate various numbers and combinations of transistor dies, tuning capacitors, leads, signal filters, inductors, shielding, traces, or other circuit elements, arranged in various configurations within a given integrated circuit device. The flexible leadframe may comprise any number of layers and may take any desired shape.

Therefore, although illustrative embodiments of the present invention have been described herein with reference to the accompanying drawings, it is to be understood that the invention is not limited to those precise embodiments, and that various other changes and modification may be made by one skilled in the art without departing from the scope or spirit of the invention.

What is claimed is:

1. An integrated circuit device comprising:
   a heat spreader comprising a top surface and a bottom surface;
   at least one integrated circuit die attached to the top surface of the heat spreader; and
   a flexible leadframe attached to the top surface of the heat spreader and comprising one or more flexible layers including at least one flexible insulating layer, a plurality of electrically conductive traces defined on the at least one flexible insulating layer, and at least one embedded circuit component, wherein the one or more flexible layers are configured for use as a flexible leadframe in the integrated circuit device.

2. The integrated circuit device of claim 1, wherein two or more flexible layers are stacked together.

3. The integrated circuit device of claim 1, wherein the flexible leadframe and the top surface of the heat spreader define an interior area configured for receiving the at least one integrated circuit die, and wherein the integrated circuit die is electrically connected to the flexible leadframe.

4. The integrated circuit device of claim 1, further comprising a lid attached to the flexible leadframe, wherein the lid encloses an interior area configured for receiving the at least one integrated circuit die.

5. The integrated circuit device of claim 4, wherein the lid comprises at least one of metal, plastic, polyimide, plastic with metal coating, and ceramic.

6. The integrated circuit device of claim 1, wherein the at least one embedded circuit component comprises one or more signal filters.

7. The integrated circuit device of claim 1, wherein the at least one embedded circuit component comprises one or more tuning capacitors.

8. The integrated circuit device of claim 1, wherein the at least one embedded circuit component comprises one or more inductors.

9. A flexible leadframe comprising:
one or more flexible layers comprising at least one flexible insulating layer;
a plurality of electrically conductive traces defined on the at least one flexible insulating layer; and
at least one embedded circuit component;
wherein the one or more flexible layers are configured for use as a flexible leadframe in an integrated circuit device.

10. The flexible leadframe of claim 9, wherein two or more flexible layers are laminated together.

11. The flexible leadframe of claim 9, wherein the one or more flexible layers comprise at least one polyimide layer.

* * * * *